United States Patent [19]

Isa

[11] Patent Number: 6,067,271
[45] Date of Patent: May 23, 2000

[54] SEMICONDUCTOR MEMORY DEVICE AND A DRIVING METHOD OF THE SAME

[75] Inventor: Satoshi Isa, Tokyo, Japan

[73] Assignee: NEC Corporation, Tokyo, Japan

[21] Appl. No.: 09/186,683

[22] Filed: Nov. 5, 1998

[30] Foreign Application Priority Data

Nov. 7, 1997 [JP] Japan ..................................... 9-305505

[51] Int. Cl.[7] ................................................... G11C 8/00
[52] U.S. Cl. .................. 365/230.03; 365/63; 365/230.06
[58] Field of Search ......................... 365/230.03, 189.01, 365/189.04, 230.06, 233, 63

[56] References Cited

U.S. PATENT DOCUMENTS

| | | | |
|---|---|---|---|
| 5,675,529 | 10/1997 | Poole ......................................... | 365/63 |
| 5,831,924 | 11/1998 | Nitta et al. .......................... | 365/230.03 |
| 5,923,605 | 7/1999 | Mueller et al. ..................... | 365/230.03 |
| 5,930,196 | 7/1999 | Yim ..................................... | 365/230.06 |

*Primary Examiner*—David Nelms
*Assistant Examiner*—Thong Le

*Attorney, Agent, or Firm*—Young & Thompson

[57] ABSTRACT

For preventing skews between connecting timing of local I/O lines to global I/O lines and that to bit lines and reducing chip size as well, a semiconductor memory device, having a plurality of banks (10a and 10b) each comprising a plurality of sub-arrays (20) arranged in matrix, global I/O-line pairs (40) extending in a y-direction traversing the banks (10a and 10b) and each shared by two columns of the sub-arrays (20), local I/O-line pairs (30) extending in a x-direction and each traversing sub-arrays (20) of each row of the two columns, and column-selection lines (33) extending in the y-direction traversing the sub-arrays of columns of each of the banks (10a and 10b) for selecting bit-line pairs (34) to be connected to the local I/O-line pairs, comprises I/O switch lines (60), whereof each is extending along with each of the global I/O-line pairs in each of the banks (10a and 10b), for transmitting a column-activating signal for connecting the global I/O-line pairs (40) to the local I/O-line pairs (30) of a row of the sub-arrays (20) to be accessed. The local I/O-line pairs (30) are connected to the global I/O-lines (40) according to AND logic of the column-activating signal and row-activating signal for activating the row of the sub-arrays to be accessed.

12 Claims, 6 Drawing Sheets

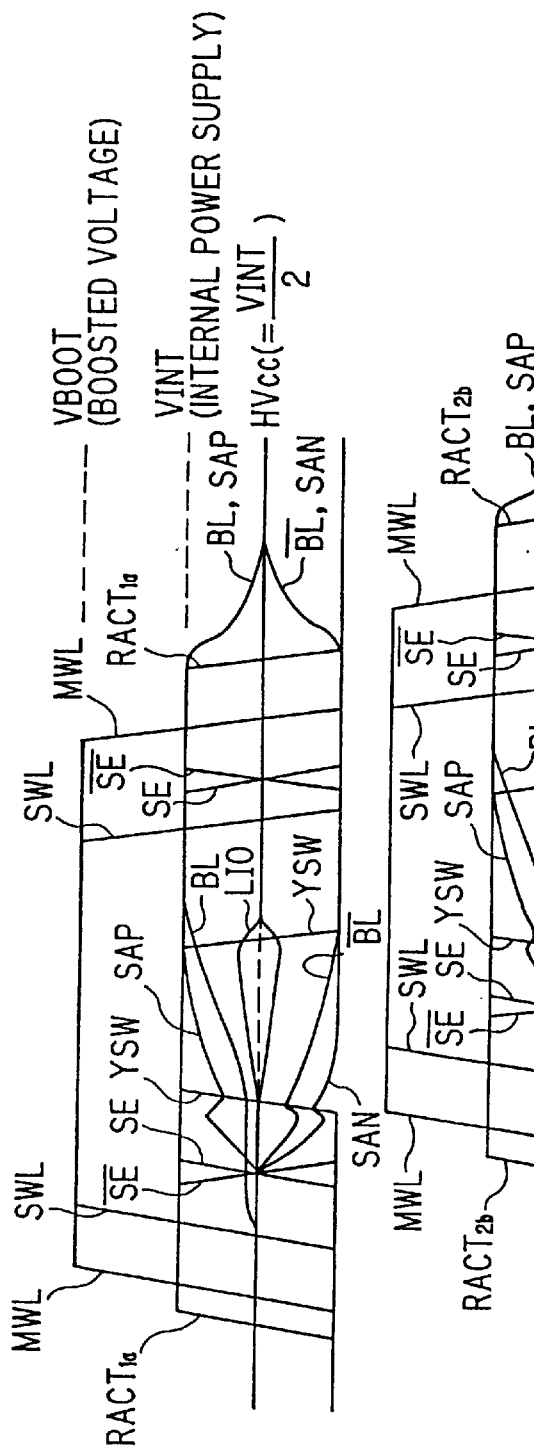
FIG. 2A
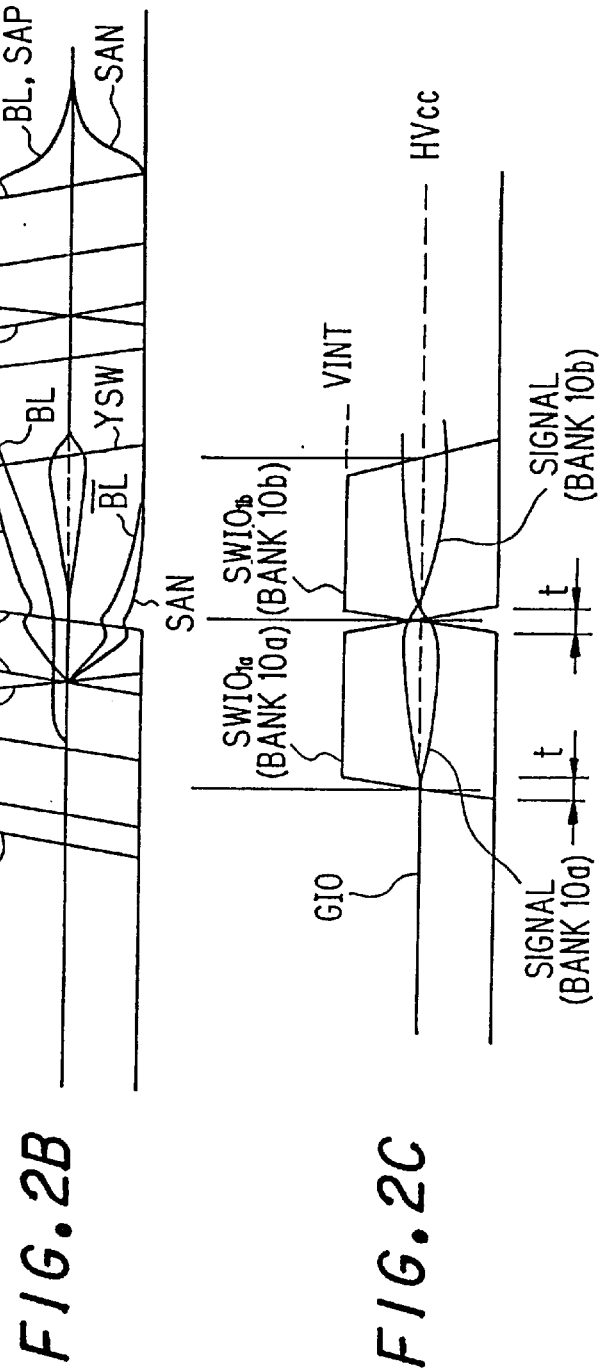
FIG. 2B
FIG. 2C

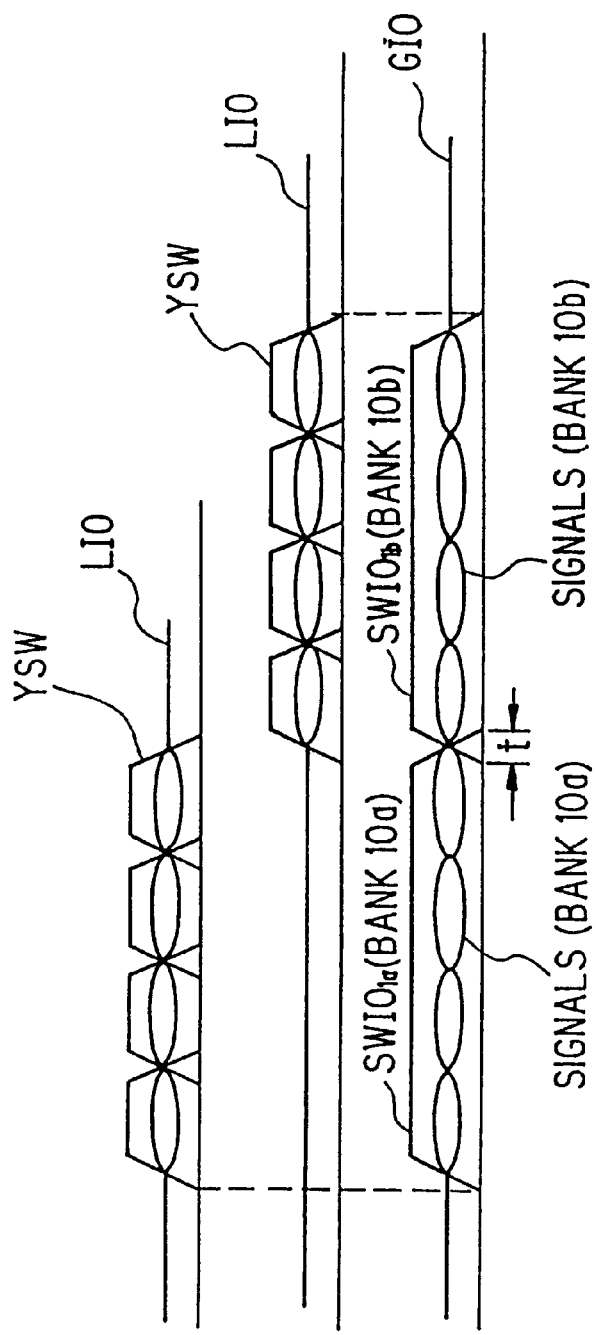

SEMICONDUCTOR MEMORY DEVICE AND A DRIVING METHOD OF THE SAME

BACKGROUND OF THE INVENTION

The present invention relates to a semiconductor memory device, and particularly to a semiconductor memory device having a plurality of banks whereof I/O (Input/Output) lines consist of global and local I/O lines.

In a semiconductor memory device having a plurality of banks, there are provided global and local I/O lines. The global I/O lines are commonly provided for the plurality of banks, and local I/O lines in a bank are connected to the global I/O lines when information reading/writing of sub-arrays in the bank is performed.

FIG. 4A is a schematic diagram illustrating a configuration example of a conventional semiconductor memory device consisting of a plurality of banks.

In the example of FIG. 4A, there are illustrated two banks 110a and 110b, each comprising sub-arrays 120 arranged in matrix of rows (i=1 to 4)×columns (j=11, 12, 21, 22).

A main word-decoder (XDEC) is provided for each row of the sub-arrays 120 and main word-lines (MWL) 131 are extending from each main word-decoder (XDEC) in an x-direction traversing the sub-arrays 120. A column-decoder (YDEC) is provided for each column of the sub-arrays 120 of each bank and column-selection lines (YSW) 133 are extending from each column-decoder (YDEC) in a y-direction traversing the sub-arrays 120.

In each of the sub-arrays 120, bit-line pairs (BL) 134 are extending from a sense-amplifier unit (SA) 121 in the y-direction, and sub-word-lines (SWL) 132 are extending in the x-direction from a right-side and a left-side sub-word driver unit (SWD), alternately, for example.

For each two columns (j=11 and 12, or 21 and 22), in the example, of the sub-arrays 120 of the two banks 110a and 110b, a read/write amplifier (R/W AMP) 150 is provided. From each read/write amplifier (R/W AMP) 150, a global I/O-line pair (GIO) 140 is extending in the y-direction traversing the two banks 110a and 110b, and a local I/O-line pair (LIO) 130 is extending in the x-direction traversing each two sub-arrays 120 arranged in a row of the two columns sharing the global I/O-line pair (GIO) 140.

For each row (i=1 to 4) of each bank, a row-activating line $RACT_i$ (i=1a to 4a in the bank 110a and 1b to 4b in the bank 110b) is provided extending in the x-direction traversing the sub-arrays 120 of the row.

Further, a column-activating-signal line ($RWS_i$: i=1a to 4a in the bank 110a and 1b to 4b in the bank 110b) 160, which controls connection of the local I/O-line pairs (LIO) 130 to the global I/O-line pairs (GIO) 140, is extending in the x-direction traversing the sub-arrays 120 of each row of the two banks 110a and 110b. The column-activating-signal line ($RWS_i$) 160 is enabled according to AND logic of the row-activating line $RACT_i$ and bank-selection signal RWSa or RWSb for designating a bank (110a or 110b) to be accessed, respectively.

Now, operation of the semiconductor memory device of FIG. 4A is described also referring to a circuit diagram of FIG. 4B which illustrates a circuit configuration of a part B of FIG. 4A.

When information is written into a specific sub-array 120, a row-activating line $RACT_i$ ($RACT_{1b}$, for example) of a row of the sub-array 120 is raised up, and one of the main word-lines (MWL) 131 shared by the sub-array 120 is enabled by a main word-decoder XDEC, which enable one of the sub-word-lines (SWL) 132 of the sub-array 120 selected by a sub-word-driver SWD of either side of the sub-array 120.

Data to be written in the sub-array 120 is transmitted to the two banks 110a and 110b by way of a global I/O-line pair (GIO) 140 from a read/write amplifier (R/W AMP) 150 which are shared by the sub-array 120. In synchronization with data transmission, a bank-selection signal (RWSb, for example), and consequently, a column-activating-signal line ($RWS_{1b}$, in the example) is enable, whereby a local I/O-line pair (LIO) 130 shared by the sub-array 120 is connected to the global I/O-line pair (GIO) 140 by a transfer gate TRG1 which becomes ON according logic of a corresponding column-activating-signal line ($RWS_i$) 160.

At the same time, one of the bit-line pairs (BL) 134 of the sub-array 120 is connected to the local I/O-line pair (LIO) 130 by a transfer gate TRG2 which becomes ON according to logic of corresponding one of the column-selection lines (YSW) 133 selected by the column-decoder YDEC shared the sub-array 120.

Thus, the information transmitted through the global I/O-line pair (GIO) 140 is written into a memory cell MC on the bit-line pair (BL) 134 enabled by the sub-word-line (SWL) 132, of the sub-array 120.

When the information written in the sub-array 120 is to be read out, a main word-line MWL 131 and a sub-word-line SWL 132 is enabled according to rise-up of a corresponding row-activating line $RACT_i$ in the same way with information writing. Then, the local I/O-line pair (LIO) 130 shared by the sub-array 120 is connected to the global I/O-line pair (GIO) 140 according to logic of the corresponding column-activating-signal line ($RWS_i$) 160, and, at the same time, one of the bit-line pairs (BL) 134 of the sub-array 120 is connected to the local I/O-line pair (LIO) 130 selected by logic of the column-selection lines (YSW) 133.

Thus, information stored in a memory cell MC of the bit-line pair (BL) 134 enabled by the sub-word-line (SWL) 132 is sensed and amplified by a sense-amplifier element SAE of the sense-amplifier unit (SA) 121, and transmitted through the local I/O-line pair (LIO) 130 to the global I/O-line pair (GIO) 140 to be read out and amplified by the read/write amplifier (R/W AMP) 150.

However, in conventional semiconductor memory devices such as illustrated in FIG. 4A, the column-activating-signal line ($RWS_i$) 160 should be provided for every row of the sub-arrays 120 for controlling connection of the local I/O-line pair (LIO) 130 to the global I/O-line pair (GIO) 140, which needs number of wirings, resulting in increase of memory chip size.

Further, the column-activating-signal line ($RWS_i$) 160 are extending in the x-direction traversing the sub-arrays 120 arranged in rows, while the column-selection lines (YSW) 133 are extending in the y-direction traversing the sub-arrays arranged in columns. In many cases, length of rows of the sub-arrays is longer than length of columns of the sub-arrays in a bank. Therefore, there may be derived skew between connecting timing of the local I/O-line pair (LIO) 130 to the global I/O-line pair (GIO) 140 and that to the bit-line pair (BL) 134, because of difference of parasitic capacitance or wiring impedance between the column-activating-signal line ($RWS_i$) 160 and the column-selection lines (YSW) 133, resulting in access delay.

SUMMARY OF THE INVENTION

Therefore, a primary object of the present invention is to provide a semiconductor memory device having global I/O lines and local I/O lines, wherein skew between connecting timing of the local I/O lines to the global I/O lines and that to the bit lines can be prevented and a number of wirings can be reduced as well.

In order to achieve the object, in a semiconductor memory device of the invention having a plurality of banks ranged in a y-direction each comprising a plurality sub-arrays arranged in matrix, global I/O-line pairs extending in the y-direction traversing the banks and each shared by a certain number of columns of the sub-arrays, read/write amplifiers each connected with each of the global I/O lines, local I/O-line pairs extending in an x-direction perpendicular to the y-direction and each traversing sub-arrays of each row of the certain number of columns, column-selection lines extending in the y-direction traversing the sub-arrays of columns of each of the banks for transmitting signals for selecting bit-line pairs to be connected to the local I/O-line pairs, and I/O switch lines for transmitting a signal for connecting the global I/O-line pairs to the local I/O-line pairs of a row of the sub-arrays to be accessed;

each of the I/O switch lines is extending along with each of the global I/O-line pairs in the y-direction of each of the banks, and the local I/O-line pairs are connected to the global I/O-lines according to AND logic of the signal transmitted though the I/O switch lines and a row-activating signal for activating the row of the sub-arrays to be accessed.

Therefore, the column-activating signal for connecting the global I/O-line pairs to the local I/O-line pairs is transmitted by way of the I/O switch lines extending in parallel to the column-selection lines for connecting the local I/O-line pairs to the bit-line pairs, and hence, the signal of the bit-line pairs can be transmitted to the global I/O-line pairs at high speed through the local I/O-line pairs without delay of connection timings because of skews caused by difference of parasitic capacitance or wiring impedance between wiring for transmitting the column-activating signals and the column-selection signals, enabling to shorten the cycle time of memory cell accesses.

Further, the width in the y-direction of a bank is generally shorter than the width in the x-direction. Therefore, the chip space needed for wirings can be reduced compared to the conventional semiconductor memory device.

Still further, the global I/O-line pairs and the local I/O-line pairs are short-circuited and the read/write amplifiers are disabled at time intervals where the access bank is switched from one to another, in the invention. Therefore, signal errors because of overlapping of signals of two banks are prevented and charging time of the global I//O-line pairs and the local I/O-line pairs can be shortened.

BRIEF DESCRIPTION OF THE DRAWINGS

The foregoing, further objects, features, and advantages of this invention will become apparent from a consideration of the following description, the appended claims, and the accompanying drawings wherein the same numerals indicate the same or the corresponding parts.

In the drawings:

FIG. 2A is a timing chart illustrating signal transitions in the bank 10a of FIG. 1A;

FIG. 2B is a timing chart illustrating signal transitions in the bank 10b of FIG. 1A;

FIG. 2C is a timing chart illustrating signal transitions concerning the global I/O-line pair (GIO) 40 shared by the banks 10a and 10b;

FIG. 3A is a timing chart illustrating signal transitions of the bank 10a when the semiconductor device of FIG. 1A is controlled with a burst length of four cycles;

FIG. 3B is a timing chart illustrating signal transitions of the bank 10b when the semiconductor device of FIG. 1A is controlled with a burst length of four cycles;

FIG. 3C is a timing chart illustrating signal transitions concerning the global I/O-line pair (GIO) 40 shared by the banks 10a and 10b when the semiconductor device of FIG. 1A is controlled with a burst length of four cycles;

DETAILED DESCRIPTION OF THE PREFERRED EMBODIMENTS

Now, embodiments of the present invention will be described in connection with the drawings.

Figure 1A:
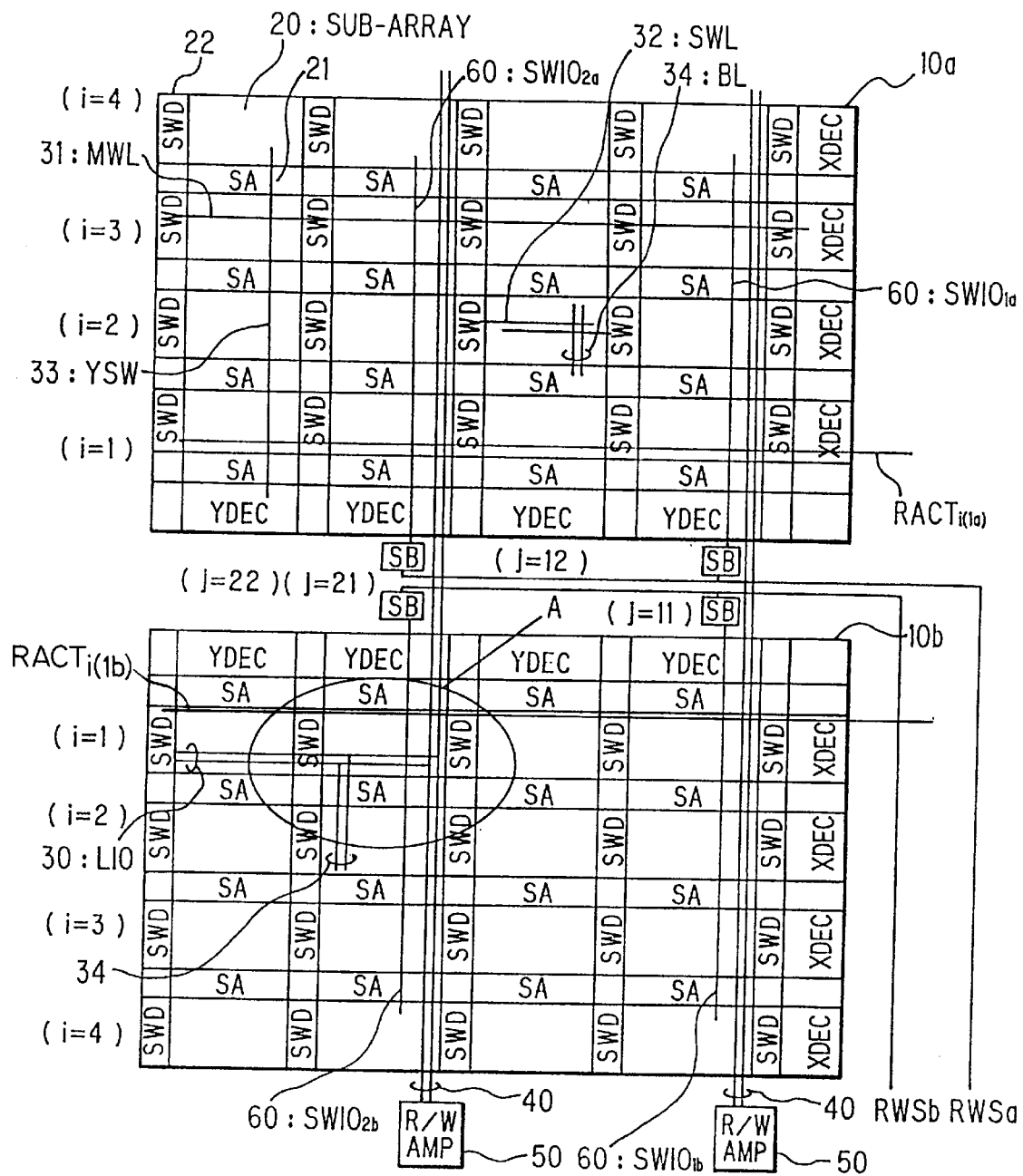
FIG. 1A is a schematic diagram illustrating a semiconductor memory device according to an embodiment of the invention.

FIG. 1A is a schematic diagram illustrating a semiconductor memory device according to an embodiment of the invention.

Referring to FIG. 1A, the semiconductor memory device of the embodiment comprises banks 10a and 10b, each comprising sub-arrays 20 arranged in matrix of rows (i=1, 2, 3, 4)×columns (j=11, 12, 21, 22).

Figure 4A:
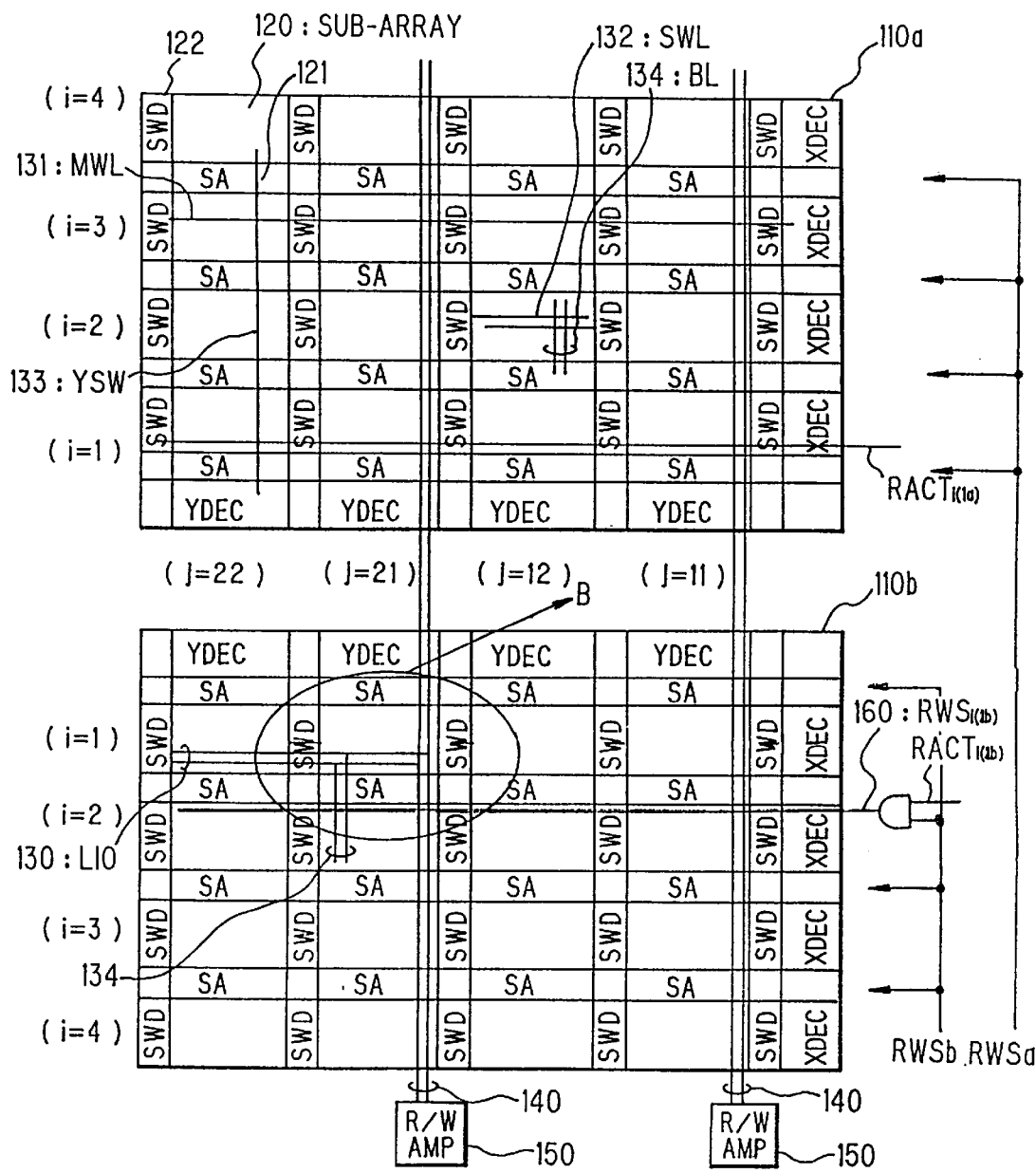
FIG. 4A is a schematic diagram illustrating a configuration example of a conventional semiconductor memory device.

In the same way with the conventional semiconductor memory device of FIG. 4A, a main word-decoder XDEC is provided for each row of the sub-arrays 20 and main word-lines (MWL) 31 are extending from each XDEC in an x-direction traversing the sub-arrays 20. A column-decoder (YDEC) is provided for each column of the sub-arrays 20 of each bank and column-selection lines (YSW) 33 are extending from each column decoder (YDEC) in a y-direction traversing the sub-arrays 20.

In each of the sub-arrays 20, bit-line pairs (BL) 34 are extending from a sense-amplifier unit (SA) 21 in the y-direction, and sub-word-lines (SWL) 32 are extending in the x-direction from a right-side and a left-side sub-word driver unit (SWD), alternately, for example.

For each two columns of the sub-arrays 20 of the two banks 10a and 10b, a read/write amplifier (R/W AMP) 50, which is activated according to OR logic of the column-selection lines (YSW) 33 of corresponding two columns of the sub-arrays 20 of the two banks 10a and 10b. From each read/write amplifier (R/W AMP) 50, a global I/O-line pair (GIO) 40 is extending in the y-direction traversing the two banks 10a and 10b, and a local I/O-line pair (LIO) 30 is extending in the x-direction traversing each two sub-arrays 20 arranged in a row of the two columns sharing the global I/O-line pair (GIO) 40.

For each row (i=1 to 4) of each bank, a row-activating line $RACT_i$ (i=1a to 4a in the bank 10a and 1b to 4b in the bank 10b) is provided extending in the x-direction traversing the sub-arrays of the row.

Further, instead of the column-activating-signal line $(RWS_i)$ 160 of the conventional semiconductor memory device of FIG. 4A, an I/O switch line $(SWIO_j:$ i=1a, 1b, 2a, 2b) 60 is provided for each two columns of the sub-arrays 20 of each bank 10a or 10b, extending in the y-direction along with each global I/O-line pair (GIO) 40. The I/O switch lines (SWIO$_i$) of each bank are enabled by switch-line buffers SB according to logic of corresponding bank-selection signal RWSa or RWSb.

Figure 1B:
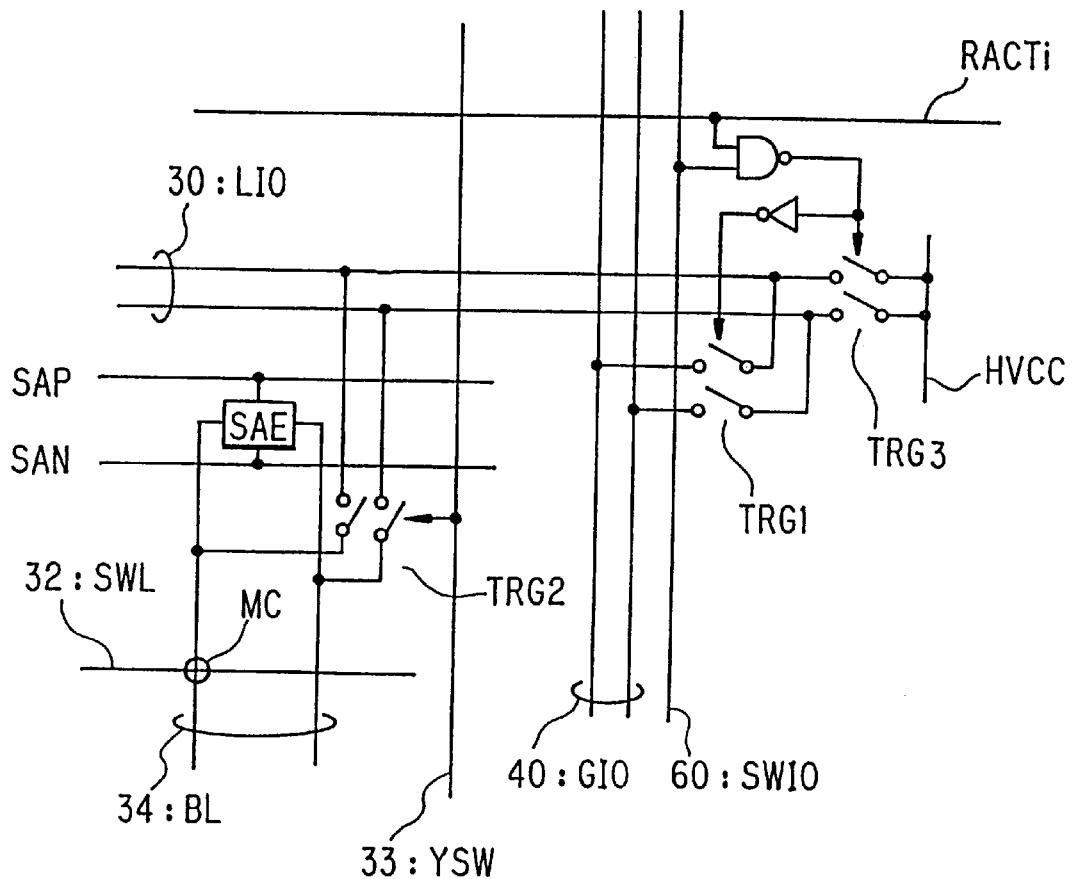
FIG. 1B is a circuit diagram illustrating a partial circuitry of a part A of FIG. 1A.

FIG. 1B is a circuit diagram illustrating a partial circuitry of a part A of FIG. 1A.

In the embodiment, the global I/O-line pair (GIO) 40 is connected with the local I/O-line pair (LIO) 30 by a transfer gate TRG1. The transfer gate TRG1 becomes ON controlled by AND logic of the I/O switch line SWIO$_i$ 60, which indicates active status of corresponding bank, that is, every two columns, of the sub-arrays 20 of either bank sharing the global I/O-line pair (GIO) 40, and a row-activating line (RACT$_i$) indicating active status of the corresponding row of the sub-arrays 20.

Figure 4B:
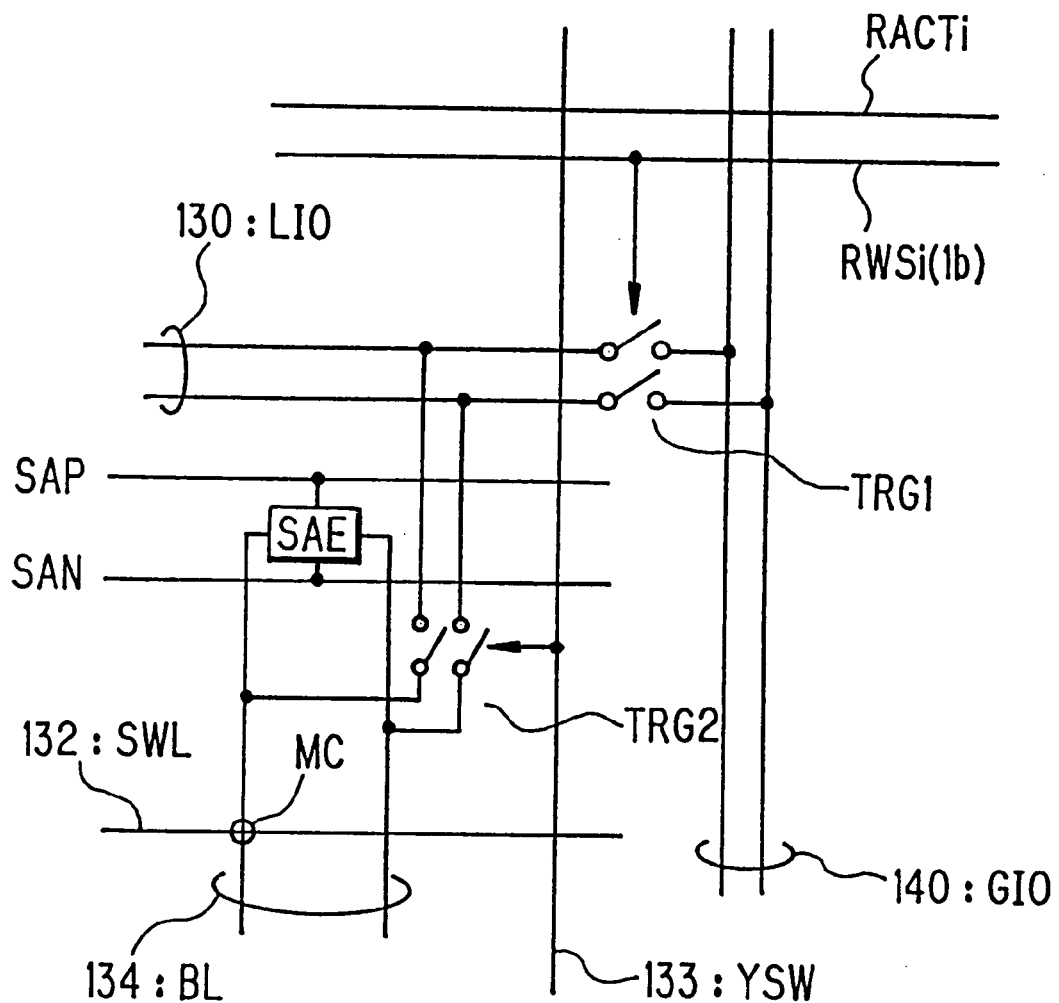
FIG. 4B is a circuit diagram illustrating a partial circuitry of a part B of FIG. 4A.

The bit-line pair (BL) 34 is connected to the local I/O-line pair (LIO) 30 by a transfer gate TRG2 controlled according to logic of the column-selection lines (YSW) 33, in the same way with the conventional semiconductor memory device of FIG. 4B.

Now, operation of the semiconductor memory device of FIG. 1A is described referring to timing charts of FIGS. 2A to 2C.

FIGS. 2A and 2B show signal transitions in the banks 10a and 10b, respectively, and FIG. 2C shows signal transitions concerning the global I/O-line pair (GIO) 40 shared by the banks 10a and 10b.

For the first, a row-activating line (RACT$_{1a}$, for example, for enabling a first row of the sub-arrays 20 of the bank 10a) is raised up, and one of the main word-lines (MWL) 31 of the row and selected sub-word-lines (SWL) 32 are raised up following the row-activating line RACT$_{1a}$, whereby bit-line pairs (BL) 32 concerning the sub-word-lines 32 begin to be charged, as illustrated in FIG. 2A.

Then, sense-amplifier-enabling signals SE and $\overline{\text{SE}}$ are enabled for charging sense-amplifier driver lines SAP and SAN, and signals of the bit-line pairs (BL) 34 begin to be amplified.

Then, selected done of the column-selection lines (YSW) 33 and the I/O switch line (SWIO$_{1a}$) 60 of the bank (10a, in this case) are enabled at the same time, to connect one of the bit-line pairs (BL) 34 to the global I/O-line pairs (GIO) 40 by way of the local I/O-line pair (LIO) 30.

Thus, the local I/O-line pair (LIO) 30 and the global I/O-line pair (GIO) 40 are charged with the signal of the selected one of the bit-line pairs (BL) 34 being amplified by a sense-amplifier element SAE, and the signal, that is, information stored in a designated memory cell MC of the bank 10a, is outputted through the read/write amplifier (R/W AMP) 50.

Then, the column-selection lines (YSW) 33 and the I/O switch line (SWIO$_{1a}$) 60 of the bank 10a are disabled and a selected column-selection line (YSW) 33 and the I/O switch line (SWIO$_{1b}$) 60 of the other bank 10b are enabled in turn as shown in FIGS. 2A to 2C.

Preceding enabling of the column-selection line (YSW) 33 and the I/O switch line (SWIO$_i$) 60 of the bank 10b, a row-enabling signal of the bank 10b (RACT$_{2b}$, for example) is raised up and a main word-line (MWL) 31, sub-word-lines 32, and the sense-amplifier-enabling signals SE and $\overline{\text{SE}}$ of the concerning row are enabled, and thus, information stored in a designated memory cell MC of the bank 10b, is outputted through the read/write amplifier (R/W AMP) 50 in turn, in the same way as described in connection with the bank 10a.

Here, it is to be noted that during a time interval t of FIG. 2C, where the global I/O-line pair (GIO) 40 is switched from the local I/O-line pair (LIO) 30 of the bank 10a into the local I/O-line pairs (LIO) 30 of the bank 10b, the global I/O-line pair (GIO) 40 is short-circuited at a reference voltage level HVCC, in the embodiment, in order to prevent the read/ write amplifier (R/W AMP) 50 from outputting an error signal caused by overlapping of two signals. This short-circuit of the global I/O-line pair (GIO) 40 is also effective for reducing charging time of the global I/O-line pair (GIO) 40 when logic of the output signal turns.

As to the local I/O-line pair (LIO) 30, it is also short-circuited at the reference voltage HVCC by way of a transfer gate TRG3 during the I/O switch line (SWIO$_i$) 60 is disabled in the embodiment, as shown in FIG. 1B.

Heretofore, operation of the semiconductor memory device of FIG. 1A when it is controlled with a burst length of one cycle is described, wherein accesses to the two banks 10a and 10b are performed alternately.

FIGS. 3A to 3C are timing charts illustrating operation of the semiconductor device of FIG. 1A controlled with a burst length of four cycles.

In the case where the burst length has length of four cycles, the access to the bank 10a, for example, described referring to FIG. 2A is repeated four times as shown in FIG. 3A, by selecting four column-selection lines (YSW) 33 one after another, while enabling the I/O switch line (SWIO$_i$) 60 of the bank 10a continuously for the burst length of four cycles, as shown in FIG. 3C. Then, the control is switched to the bank 10b and the access to the bank 10b is repeated four times by selecting four column-selection lines (YSW) 33 one after another, enabling the I/O switch line (SWIO$_i$) 60 of the bank 10b continuously for the burst length.

In this case also, the global I/O-line pair (GIO) 40 is short-circuited and the read/write amplifier (R/W AMP) 50 is disabled during a time interval t of FIG. 3C, where the global I/O-line pair (GIO) 40 is switched from the local I/O-line pair (LIO) 30 of the bank 10a into the local I/O-line pair (LIO) 30 of the bank 10b.

As heretofore described, the column-activating signal for connecting the global I/O-line pair (GIO) 40 to the local I/O-line pair (LIO) 30 is transmitted to the transfer gate TRG1 by way of the I/O switch line (SWIO$_i$) 60 which is extending in the y-direction in parallel to the column-selection lines (YSW) 33, in the embodiment of FIG. 1A.

Therefore, the signal of the bit-line pair (BL) 34 can be transmitted to the global I/O-line pairs (GIO) 40 at high speed through the local I/O-line pair (LIO) 30 without delay of connection timings because of skews caused by difference of parasitic capacitance or wiring impedance between wirings for transmitting the column-activating signals and the column-selection signals, enabling to shorten the cycle time of memory cell accesses.

Further, the I/O switch line (SWIO$_i$) 60 of the embodiment is provided along with each global I/O-line pair (GIO) 40, which is provided for each two columns, for example, of the sub-arrays 20, and the width in the y-direction of a bank is generally shorter than the width in the x-direction. Therefore, the chip space needed for wirings can be reduced compared to the conventional semiconductor memory device of FIG. 4A wherein one column-activating-signal line (RWS$_i$) 160 is provided for each row of the sub-arrays 120 extending in the x-direction.

Still further, the global I/O-line pair (GIO) 40 and the local I/O-line pair (LIO) 30 are short-circuited and the read/write amplifier (R/W AMP) 50 is disabled at intervals where the access bank is switched, in the embodiment. Therefore, signal errors because of overlapping of signals of two banks are prevented and charging time of the global I/O-line pair (GIO) 40 and the local I/O-line pair (LIO) 30 can be shortened.

In the embodiment of FIG. 1A, the semiconductor memory device is depicted to have two banks 10*a* and 10*b* each having four columns of the sub-arrays. However, the scope of the invention is not limited in the embodiment of FIG. 1A. For example, more than two banks (10*c*, 10*d*, . . . ) may be comprised ranged in the y-direction. In the case, the global I/O-line pairs (GIO) 40 also extend traversing the banks 10*a*, 10*b*, 10*c*, . . . in the y-direction. Each bank may have more columns of the sub-arrays, and may share more numbers of the global I/O-line pairs (GIO) extending in parallel.

What is claimed is:

1. A semiconductor memory device having a plurality of banks ranged in a y-direction each comprising:

a plurality of sub-arrays arranged in matrix;

a global I/O (Input/Output) line pairs extending in the y-direction traversing the banks and each shared by a certain number of columns of the sub-arrays;

a plurality of read/write amplifiers, each being connected with one of the global I/O-line pairs;

local I/O-line pairs extending in an x-direction perpendicular to the y-direction and each traversing sub-arrays of each row of the certain number of columns;

column-selection lines extending in the y-direction traversing the sub-arrays of columns of each of the banks for transmitting column-selection signals for selecting bit-line pairs to be connected to the local I/O-line pairs;

I/O switch lines for transmitting a column-activating signal for connecting the global I/O-line pairs to the local I/O-line pairs of a row of the sub-arrays to be accessed;

a row-activating signal for activating the row of the sub-arrays to be accessed; and AND logic, the AND logic having as inputs the column-activating signal and the row-activating signal, an output of the AND logic providing a signal controlling connection of the local I/O-line pairs to the global I/O line pairs;

wherein each of the I/O switch lines extends along with a respective one of the global I/O-line pairs in each of the banks.

2. A semiconductor memory device as recited in claim 1; wherein the read/write amplifiers are disabled for a certain time interval when the row of the sub-arrays to be accessed is switched from one of the banks to another of the banks.

3. A semiconductor memory device as recited in claim 1; wherein the global I/O-line pairs are short-circuited for a certain time interval when the row of the sub-arrays to be accessed is switched from one of the banks to another of the banks.

4. A semiconductor memory device as recited in claim 1; wherein the local I/O-line pairs are short-circuited when the local I/O-line pairs are not connected to the global I/O-line pairs.

5. A semiconductor memory device as recited in claim 1; wherein the column-activating signal is enabled in synchronization with the column-selection signal.

6. A semiconductor memory device as recited in claim 1, wherein the read/write amplifiers are disabled for a certain time interval when the row of the sub-arrays to be accessed is switched from one of the banks to another of the banks.

7. A driving method of a semiconductor memory device having a plurality of banks ranged in a y-direction each comprising a plurality of sub-arrays arranged in matrix, global I/O-line pairs extending in the y-direction traversing the banks and each shared by a certain number of columns of the sub-arrays, read/write amplifiers each connected with each of the global I/O-lines, column-selection lines extending in the y-direction traversing the sub-arrays of columns of each of the banks for transmitting column-selection signals for selecting bit-line pairs to be connected to the local I/O-line pairs, and local I/O-line pairs extending in an x-direction perpendicular to the y-direction and each traversing sub-arrays of each row of the certain number of columns; the driving method comprising the steps of:

activating a row of the sub-arrays to be accessed by enabling a row-activating signal corresponding to the row of the sub-arrays;

enabling a column-activating signal transmitted through one of a plurality of I/O switch lines, each of the I/O switch lines extending along with a respective one of the global I/O-line pairs in each of the banks; and within a selected sub-array, logically combining the enabled column-activating signal and the enabled row-activating signal to produce a signal which enables connection between the global I/O-line pairs and the local I/O-line pairs within the selected sub-array.

8. The method of claim 7, wherein the step of logically combining the enabled column-activating signal and the enabled row-activating signal comprises the step of logically ANDing the enabled column-activating signal and the enabled row-activating signal.

9. A driving method of a semiconductor memory device as recited in claim 8, comprising the further step of short-circuiting the global I/O-line pairs for a certain time interval when the row of the sub-arrays to be accessed is switched from one of the banks to another of the banks.

10. A driving method of a semiconductor memory device as recited in claim 8, comprising the further step of disabling the read/write amplifiers for a certain time interval when the row of the sub-arrays to be accessed is switched from one of the banks to another of the banks.

11. A driving method of a semiconductor memory device as recited in claim 8, comprising the further step of short-circuiting the local I/O-line pairs when the local I/O-line pairs are not connected to the global I/O-line pairs.

12. A driving method of a semiconductor memory device as recited in claim 8; wherein the column-activating signal are enabled in synchronization with the column-selection signal.

* * * * *